United States
Harrington

4,165,493
Aug. 21, 1979

[54] PROTECTED AMPLIFIER APPARATUS

[75] Inventor: Timothy A. Harrington, Marion, Iowa

[73] Assignee: Rockwell International Corporation, El Segundo, Calif.

[21] Appl. No.: 896,650

[22] Filed: Apr. 17, 1978

[51] Int. Cl.² ............................................... H03G 3/20
[52] U.S. Cl. ........................... 330/207 P; 325/150; 325/404
[58] Field of Search ........................... 330/207 P, 298; 325/150, 151, 319, 404

[56] References Cited
U.S. PATENT DOCUMENTS

| | | | |
|---|---|---|---|
| 3,345,570 | 10/1967 | Matyckas | 330/298 X |
| 3,366,883 | 1/1968 | Griffin et al. | 325/150 X |
| 3,449,680 | 6/1969 | Schilb et al. | 330/298 |
| 3,510,790 | 5/1970 | Taamisian et al. | 330/298 X |
| 3,641,451 | 2/1972 | Hollingsworth et al. | 330/298 X |
| 3,852,669 | 12/1974 | Bowman et al. | 330/207 P X |
| 4,019,150 | 4/1977 | Lurey et al. | 330/207 P X |

*Primary Examiner*—James B. Mullins
*Attorney, Agent, or Firm*—Bruce C. Lutz; Howard R Greenberg; H. Fredrick Hamann

[57] ABSTRACT

This disclosure relates to an amplifier incorporating various devices for detecting parameters such as average power, peak power and signal voltage to be used to provide the feedback signals for automatic level control of an RF amplifier whose output signal is passed through an antenna coupler to an antenna. These detection devices allow normal operational level setting as well as minimizing the chance of overloads resulting in amplifier circuit failure during tuning conditions.

7 Claims, 6 Drawing Figures

4,165,493

PROTECTED AMPLIFIER APPARATUS

THE INVENTION

The present invention pertains generally to electronic circuitry and, more specifically, to circuitry for protecting an RF amplifier from failure due to improper antenna loads.

When a power amplifier is interfaced with many types of automatically tuned antenna couplers in multiple configurations, it becomes necessary to supply as much power as possible into variable VSWR loads to permit tuning while, at the same time, protecting the amplifier's output devices from failure. This overload protection is extremely important in solid state devices. The concept outlined herein allows maximization of output power into a wide range of VSWR loads to permit antenna coupler tuning while maintaining amplifier component integrity.

PRIOR ART

A good example of prior art thinking is illustrated in an Electronic Design magazine article of Jan. 4, 1975 commencing on Page 110. In general, the prior art comprises sensing final amplifier collector currents, temperature, VSWR, amplifier peak output voltage or some combination of these. The detected values are used to adjust the drive level to maintain these values at an acceptable level. This acceptable level is necessarily unduly conservative relative to the amplifier's capability.

It will be realized upon reflection that when amplifier output stage failure is caused by load variation in an unconditionally stable amplifier, the failure is due to either thermal or voltage overload to the output stage devices. Also, it is normally considered most desirable to be able to maximize power output capability into a load without compromising the amplifier. Thus, rather than merely reduce the power output by some prescribed amount for each potentially destructive condition, the device dissipation is a parameter which must be variably controlled so as to maximize power output into loads having a large VSWR range. If the device dissipation is controlled in conjunction with device output port instantaneous voltage, failure of the output stage devices can be prevented. The prior art techniques fail to properly monitor these two quantities of device dissipation and output instantaneous voltage and, therefore, do not optimize output power into varying load conditions.

It is, thus, an object of the present invention to provide an improved amplifier apparatus.

Other objects and advantages of the present invention will be ascertained from a reading of the specification and appended claims in conjunction with the drawings wherein:

DETAILED DESCRIPTION

Figure 1:
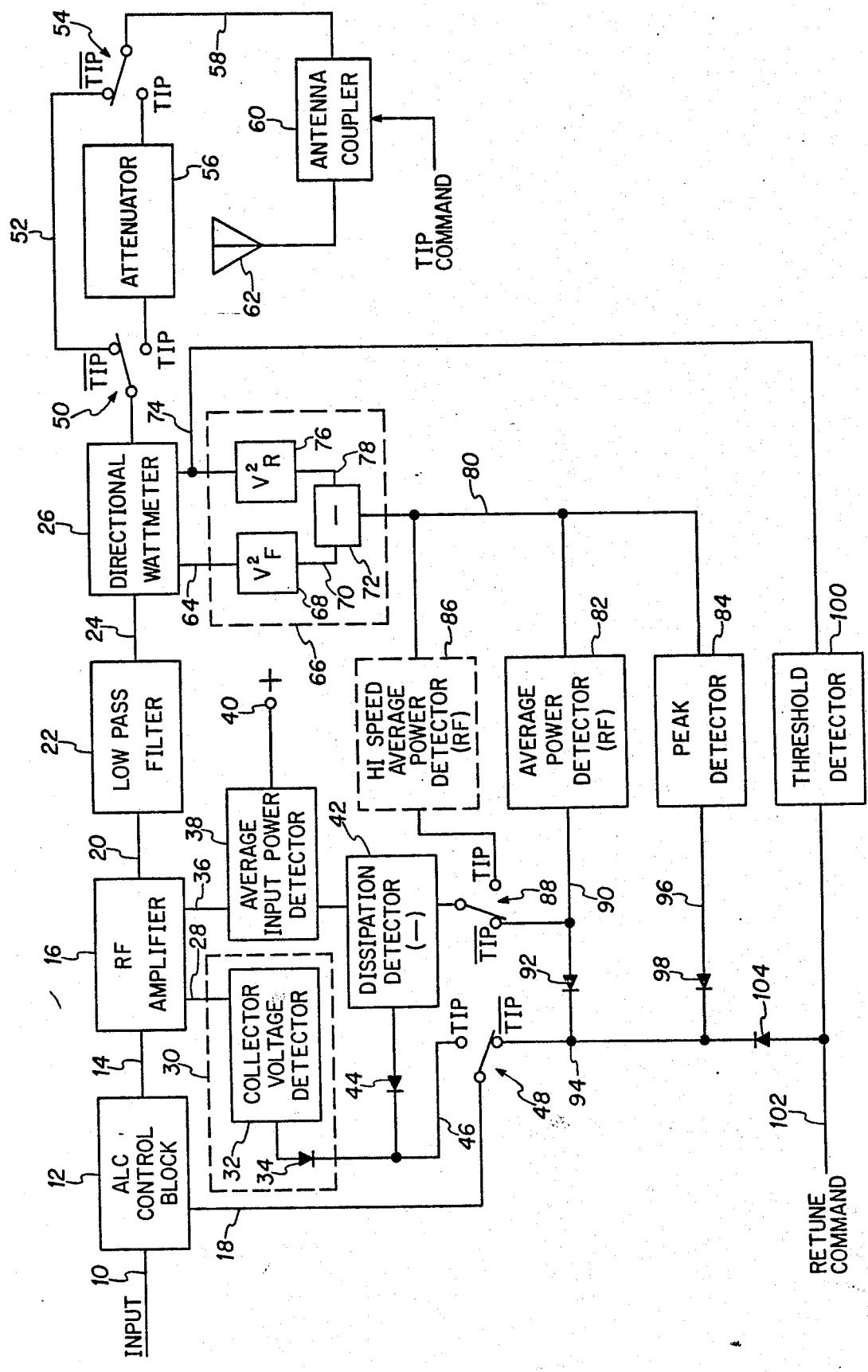
FIG. 1 is a block diagram of one embodiment of the inventive concept.

In FIG. 1, an input lead 10 provides RF signals to an ALC (automatic level control) block gain control means or feedback controller 12. This controller has the fast attack, slow decay characteristic common to ALC controllers. The RF signals may be injection carrier signals for the purpose of tuning the device or may be the modulated signals which include intelligence for radio transmission to a receiver. An output of the ALC block is supplied on a lead 14 to an RF amplifier 16. A control input to ALC block 12 is provided on a lead 18 and, thus, the input signals on input 10 are modified in amplitude in accordance with the input on 18 before they are output on lead 14. RF amplifier 16 provides a signal output on lead 20 to a low-pass filter 22 which supplies signals on a lead 24 to a directional wattmeter 26. As illustrated, RF amplifier 16 provides a sense signal on a lead 28 to a dash line block 30, including a collector voltage detector 32 and a diode 34. The signals on lead 28 represent the instantaneous voltage on the collectors of the output stage of the amplifier and these signals are used to provide an indication of high induced voltages which could cause voltage breakdown of the output transistors. A sense lead 36 from RF amplifier 16 provides a signal indicative of the instantaneous current input to the output devices of RF amplifier 16 and is applied to an average input power detector 38. Average input power detector 38 receives the input power from a power supply terminal 40. Output signals from average input power detector 38 are supplied to a subtraction circuit (also termed a dissipation detector) 42 which has an output applied through a diode 44 and then applied to a lead 46. A switch generally designated as 48 will supply the signals back to lead 18 when the switch 48 is in the TIP condition. As shown, it is in the $\overline{\text{TIP}}$ condition. Directional wattmeter 26 supplies output signals to a switch generally designated as 50 which is another stage of switch 48 which is connected by a lead 52 to a third switch 54. All of the switches 48, 50 and 54 are ganged together to operate simultaneously and are in the $\overline{\text{TIP}}$ condition during normal RF amplifier usage. The TIP condition is for "tuning in progress" and is used only to prepare the amplifier for use at a given operational frequency whereby the antenna coupler attempts to adjust the impedance levels for optimum conditions for that particular frequency. When the switches are in the TIP condition, the output of directional wattmeter 26 is supplied to an attenuator 56 and then output through switch 54 to a lead 58 which is connected to an antenna coupler 60 whose output is connected to an antenna 62.

Directional wattmeter 26 provides output signals indicative of the forward voltage through wattmeter 26 on a lead 64 to a dash line block 66. Inside block 66, the signals on lead 64 are supplied to a squaring circuit 68 which provides an output signal indicative of power passing through wattmeter 26 in the forward direction to a load, on a lead 70 to a difference circuit 72. Signals indicative of reflected voltage from the load are supplied on a lead 74 from directional wattmeter 26 into block 66 and to a squaring circuit 76 which provides output signals indicative of power reflected from (not used by) the load on lead 78 to the difference circuit 72. Block 66 may be termed a true forward power circuit whose output on lead 80 is indicative of the instantaneous difference between forward power and reflected power and, thus, of the power used by, delivered to, or dissipated in the load. The signals on lead 80 are applied to an average power detector 82 and a peak detector 84, as well as to a high speed average power detector 86 shown in dash line format. A high speed average power detector circuit such as 86 would find advantageous use under operating conditions where the amplifier output device's thermal time constant is much less than the modulation period since detector 82 must average over the period of modulation which could possibly make it too slow to properly track the average power developed in a rapidly varying load. Since tuning occurs with carrier only, detector 86 must only average over the carrier period and will, therefore, be faster reacting than detector 82. However, such a detector was not used in the detailed schematic of the present invention because the output devices thermal time constant was not short enough to warrant the additional expense of this detector 86. As illustrated, a switch 88 may be used to switch in the high speed detector for tuning rather than use the average power detector 82 for both tuning and normal operating conditions. As illustrated, the switch 88 (which is ganged with the other switches when detector 86 is used) is in a $\overline{\text{TIP}}$ condition where output signals from average power detector 82 are supplied on a lead 90 to a second input of the dissipation detection circuit 42. Signals are also supplied on lead 90 through a diode 92 to a lead 94 and through the switch 48 to the control input of block 12. Output signals from peak detector 84 are supplied on a lead 96, through a diode 98 to lead 94. Lead 74 also supplies signals indicative of the reflected voltage to a threshold detector 100 which provides output signals on a lead 102 to a retune command line and also supplies these signals through a diode 104 to lead 94.

Figure 2:
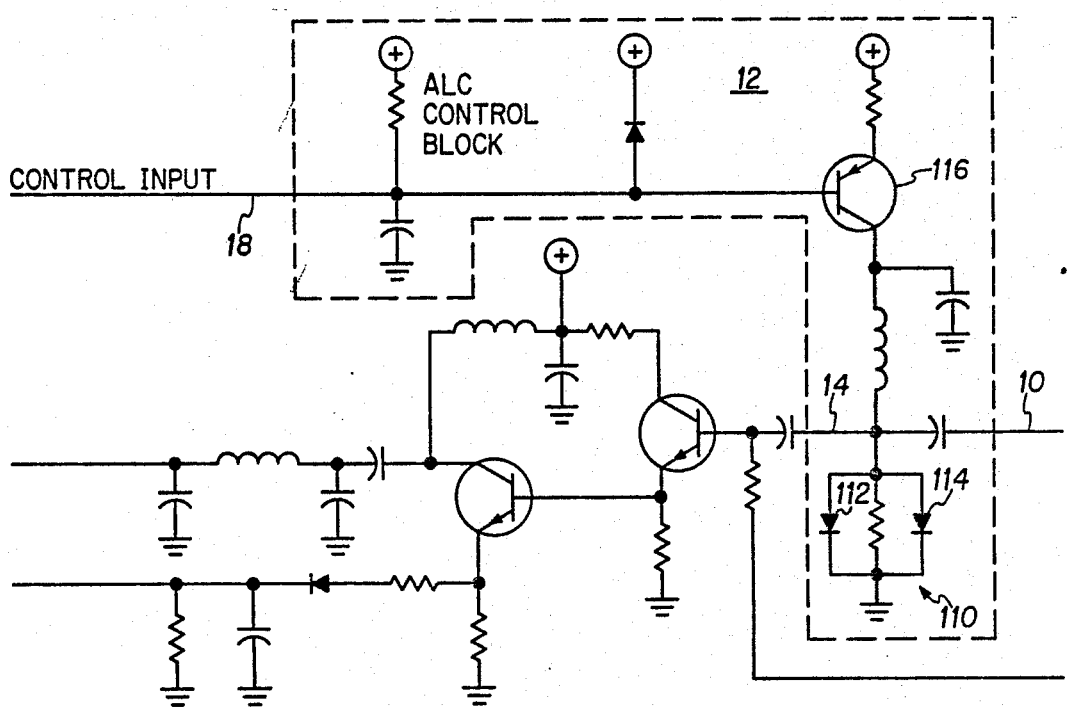
FIG. 2 is a schematic diagram showing the ALC (automatic level control) block portion of the inventive concept.

In FIG. 2, the same numbers as used in FIG. 1 are utilized to illustrate the same leads. As will be noted, signals are applied on lead 10 and output on lead 14 as modified by an attenuator generally designated as 110 having a pair of pin diodes 112 and 114 whose current flow is controlled by a transistor 116 acting in response to control signals on lead 18.

Figure 3:
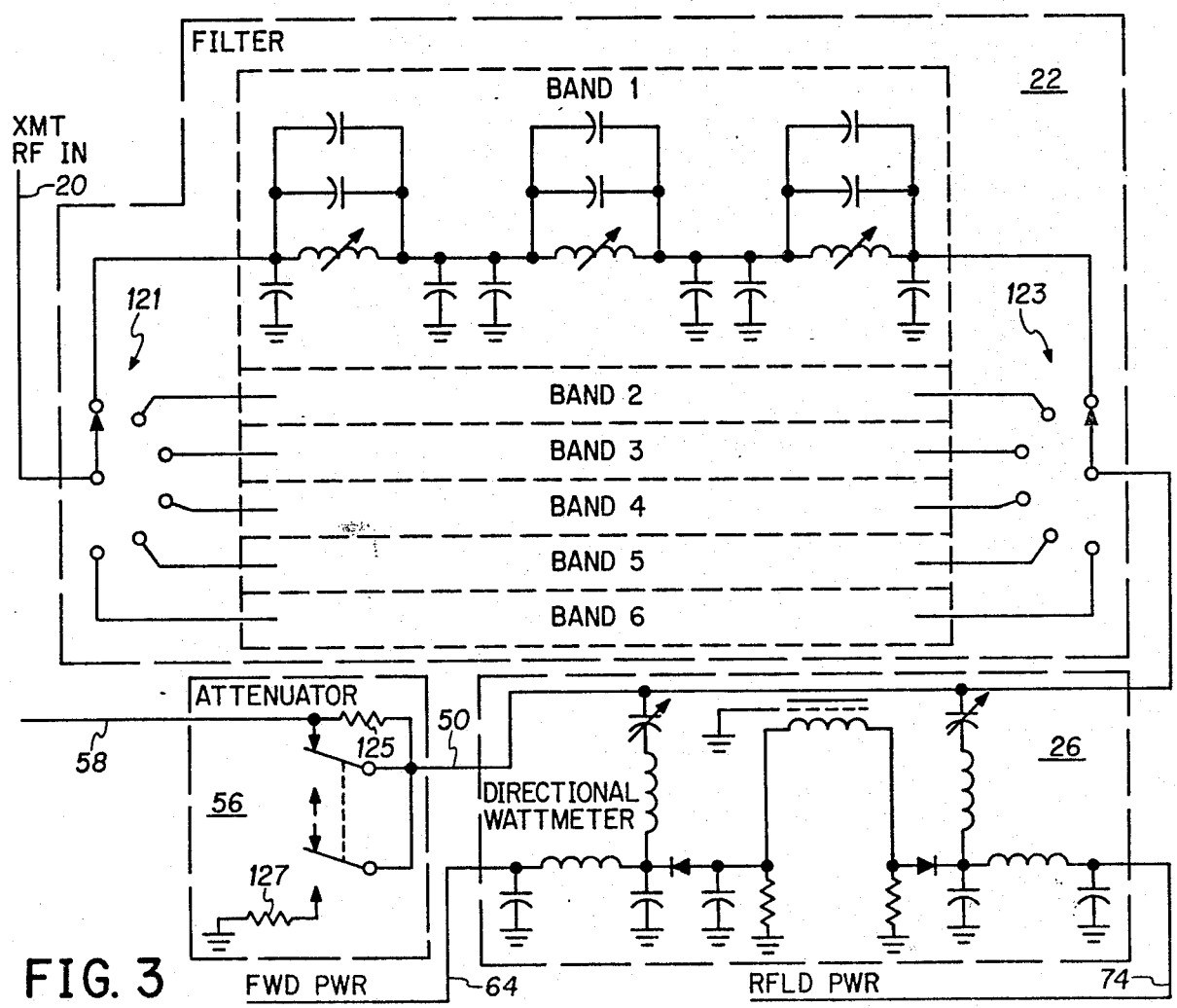
FIG. 3 is a schematic diagram illustrating the filter, directional wattmeter and attenuator portions of the blocks in FIG. 1.

In FIG. 3, the filter is shown having six bands of operating frequencies with only band 1 being shown in detail. The other bands 2 through 6 are similar in construction. Signals are applied from input 20 through a multiple position switch generally designated as 121 and output from the filter 22 by a similar switch 123. Signals output from filter 22 are passed to the directional wattmeter generally designated as 26 and passed on lead 50 to attenuator 56. This switch is shown in the $\overline{\text{TIP}}$ condition and, if changed to the alternate position, would have a resistor 125 connected in series with the signals passing therethrough and a resistor 127 shunting signals to ground to achieve the attenuation.

Figure 4A:
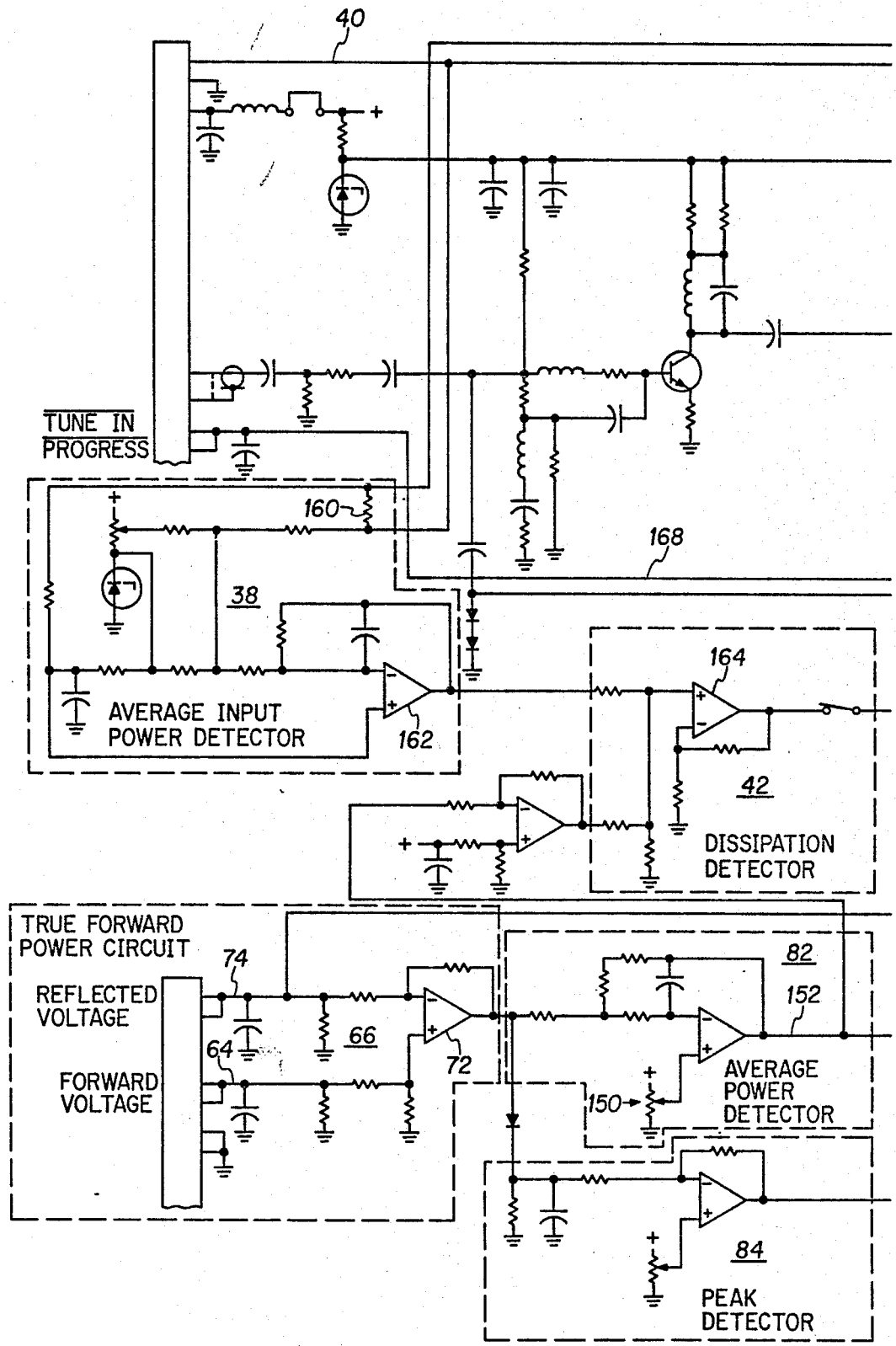
FIGS. 4a, 4b and 4c illustrate specific schematic diagrams for the RF amplifier and the detector portions of FIG. 1.
Figure 4B:
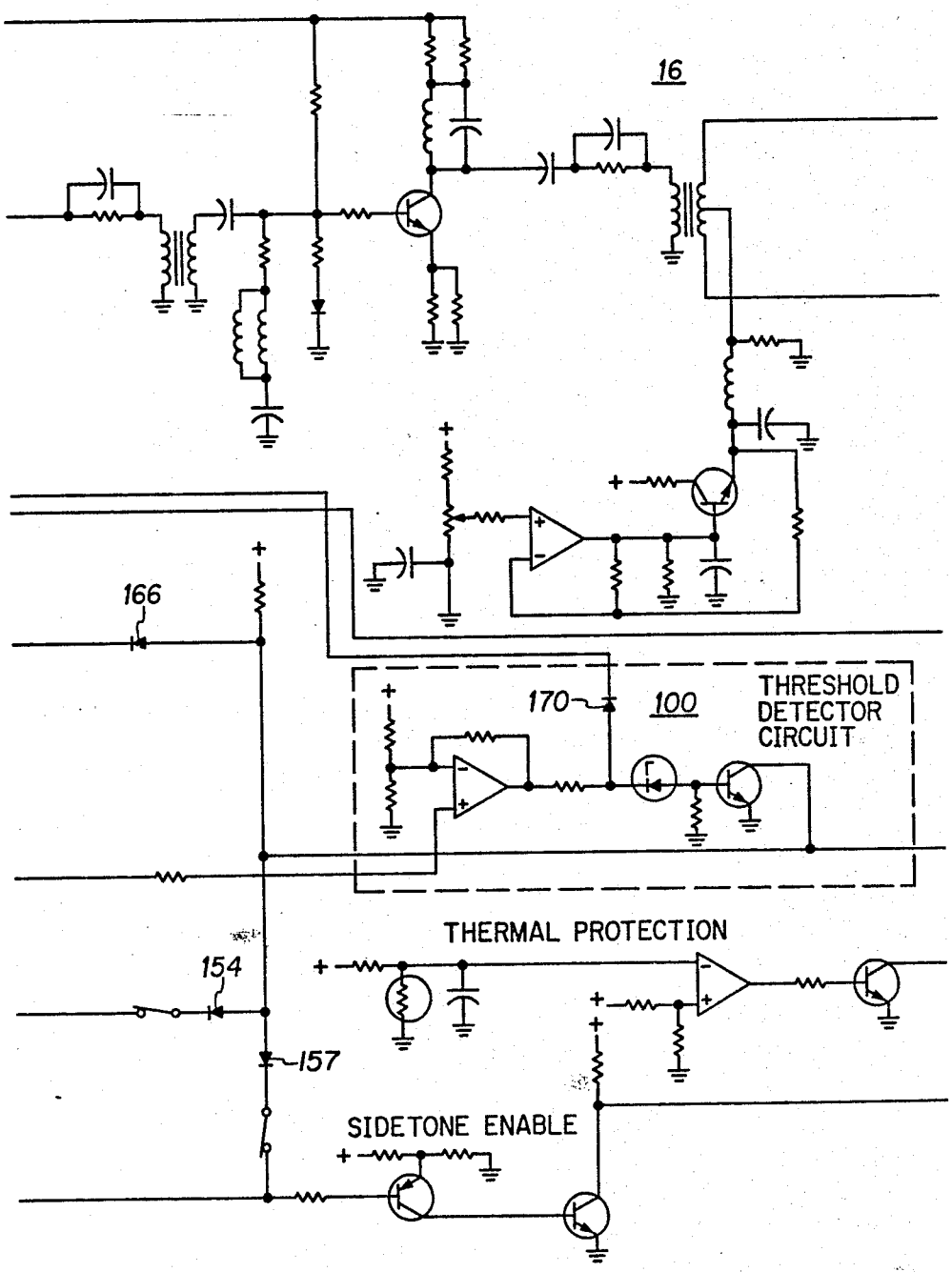
Figure 4C:
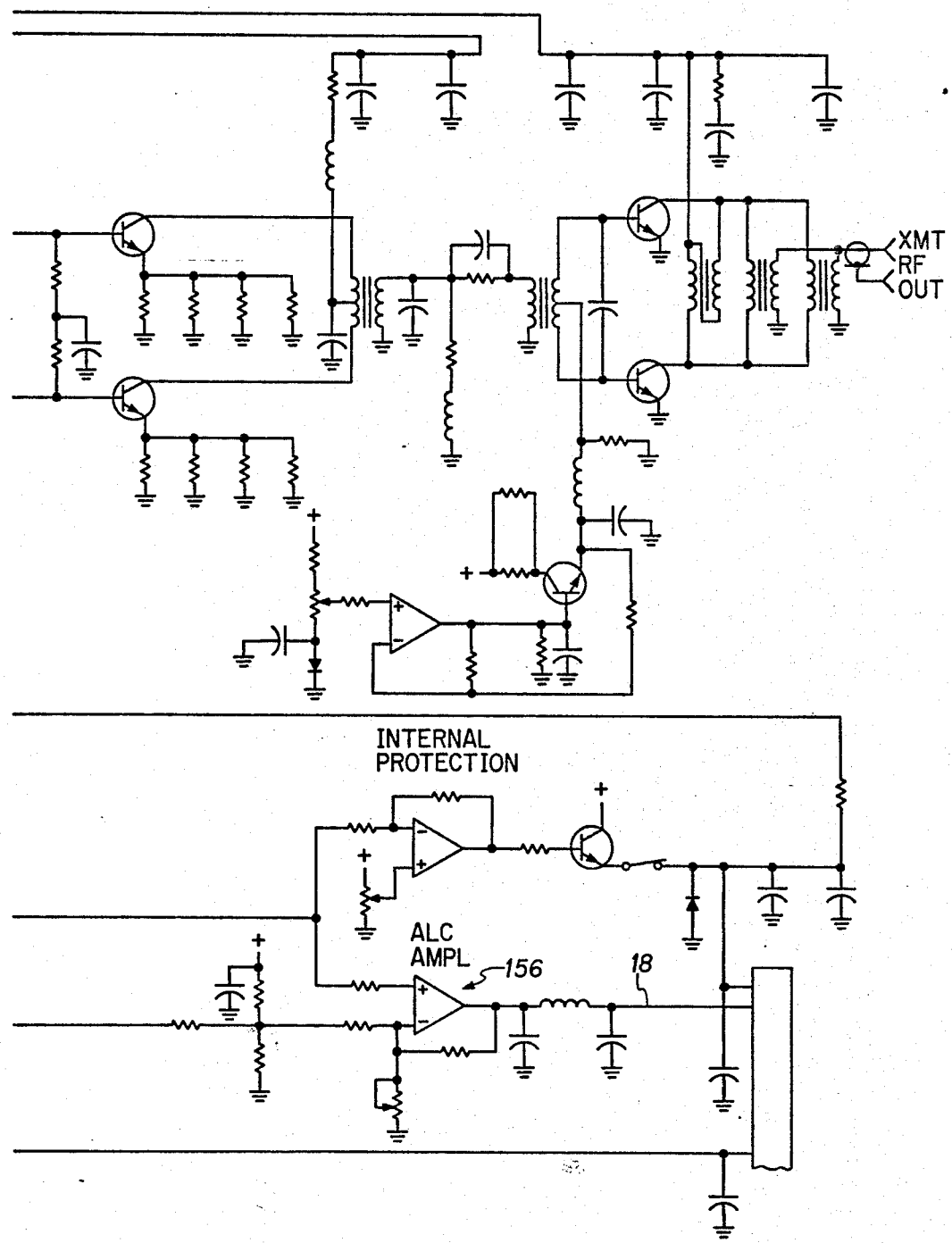

In FIGS. 4a, 4b and 4c, the same numbers as used in FIG. 1 are again used where appropriate. Forward voltage and reflected voltage signals are applied on leads 64 and 74 respectively to the forward power circuit generally designated as 66. This power circuit comprises an operational amplifier to provide the function of the subtraction circuit 72. In this particular embodiment, a linear approximation to the difference of two squares function is utilized since it is easier to implement. This approximation is utilized and allowable since the load impedance variation is confined by the attenuator during tuning. The output of power circuit 66 is then applied both to the average power detector 82 and to the PEP (Peak Envelope Power) detector 84. Each of these circuits again contains an operational amplifier. The operational amplifier in block 82 includes a potentiometer 150 which is adjusted to produce an appropriate DC analog output signal on lead 152. This signal is applied both to the dissipation detector 42 and is supplied through a diode 154 to an ALC amplifier 156. As will be noted, diode 154, as well as others in FIG. 4, are operated in the reverse logic direction from that shown in FIG. 1. However, the logic implemented is still identical. The peak detector 84 also supplies signals through a diode 157 to the ALC amplifier using the same reverse diode logic. It may be noted that thermal protection signals are also provided to the ALC amplifier 156 in the event of blower failure. The average input power detector 38 detects the current into the output stage of the amplifier via a resistor 160. The voltage obtained in this detected signal is compared against a reference in an operational amplifier 162 and output to the dissipation detector 42 wherein the signal is compared with that obtained from the average power detector 82. This comparison takes place in an operational amplifier labeled 164. An output of amplifier 164 is supplied through a diode 166 to ALC amplifier 156. A $\overline{\text{tune in progress}}$ lead 168 supplies signals to a diode 170 of the threshold detector 100. A zero voltage on this lead deactivates the threshold detector during tuning operations since the reflected voltage signals on lead 74 will prematurely trip the threshold detector during tuning operations. However, the average power to the load as detected by detector 82 during tuning conditions begin from zero with a known, controlled rise time permitting the dissipation detector 42 to properly track output device dissipation. Switch 48 does not occur explicitly on the detailed schematic because a logical equivalent was implemented due to the following considerations:

(1) Under tune conditions, the power in the load will be small, hence the peak and average power in the load appearing on leads 96 and 90, respectively, will be small during tune, hence their outputs could be tied directly to lead 18.

(2) No collector voltage detector was utilized for the specific embodiment due to the characteristics of the amplifying devices used relative to the Quality factors (Q's) of the loads encountered in the specific system operation.

(3) Only detector 82 was used to accomplish the purpose of detectors 82 and 86. This was permitted due to the relation between the lowest modulation frequency for the amplifier and the thermal time constant of the amplifying devices.

(4) The switch function was still needed to enable and disable the threshold detector and this was accomplished by lead 168 and diode 170.

Although not part of the invention, the specific circuits designated as "internal protection" and "sidetone enable" provide additional protection to the RF amplifier. Specifically, the sidetone enable circuit provides an indication that power being supplied to the load is low and there is a system fault. The internal protection circuit is used in place of the ALC control in the event of failure in the ALC circuit 12.

OPERATION

Reference should now be made to FIG. 1, as this is the preferred embodiment of the invention. In an initialization state, a particular frequency is selected for RF signal transmission. Immediately after selection, the load impedance presented to the amplifier is normally going to be nonoptimal. An improper load impedance will create a high VSWR. If the load impedance is very low, the RF amplifying devices will conduct a large amount of current attempting to feed signals to the antenna, potentially resulting in amplifier destruction. On the other hand, if the antenna impedance is extremely high, high voltages could be induced on the output transistors (amplifying devices), thereby subjecting the transistors to voltages which exceed their specifications, resulting in punch-through and possible destruction of the transistors in the output stages of amplifier 16. Thus, during tuning conditions, the attenuator 56 is inserted to provide both series and parallel impedance to keep the RF amplifier load impedance within prescribed limits. It will be realized by those skilled in the art, from reading the subsequent material, that the attenuation of block 56 can have an attenuation of as little as zero. The antenna coupler 60 operates on the amplifier load impedance to match the antenna and the output of the amplifier so as to present the appropriate (in one embodiment approximately 50 ohms) impedance to the amplifier 16 at the completion of tuning. It will thus be determined that the attenuator 56 has two functions. First, it provides a nominal load to the amplifier 16 at all times during tune, thereby making the task of stabilizing the amplifier under tuning conditions easier. Secondly, since the dissipation detection circuitry necessarily has delay (due to the integration time required) and since this delay can be on the order of the thermal time constant of the device, the attenuator limits the rate of change of the load impedance with respect to time, thereby allowing the dissipation detection circuitry to track load power and, accordingly, control device dissipation.

A side benefit of the attenuator is that, with the load impedance of amplifier 16 thus confined, it is possible to linearly approximate the $(V_F)^2$ minus $(V_R)^2$ function accomplished within true forward power circuit 66 rather than actually use a more expensive circuit which, in fact, takes the difference of two squares directly.

While the circuit is being tuned, the dissipation detector 42 takes the difference between the RF amplifier DC input power from detector 38 and the load power from detector 82 and uses the difference between the two (which is essentially a measurement of power dissipation in amplifier 16) to adjust the amplitude of the signal passing through control block 12. Since load conditions could change much more rapidly during tuning conditions, it may be desirable to have a much higher speed average power detector such as shown by dash line block 86 for tuning conditions. Thus, the output of amplifier 16 would be limited very quickly in the event of drastic changes in the output signal.

As also mentioned, there would be times when conditions in the load would create high induced voltages at the collectors of the output stage. Thus, a dash line block 30 has been included, in the preferred embodiment, which would take over the control function in the event the output stage collector voltage exceeded predetermined limits. In such an event, the signals from detector 32 would provide precedence over that obtained from dissipation detector 42 and severely reduce the output power until the collector voltage were no longer exceeded.

As will be ascertained, the primary objective of the dissipation tracking circuitry [Detectors 38,(86 or 82) and subtractor 42] and collector voltage detector during tuning is to maintain a maximum signal flow to the antenna so that the coupler 60 will be supplied enough "Tune Power" so that it can become properly adjusted while still protecting amplifier from failure due to thermal or voltage overload.

Once tuning is complete, the attenuator 56 is removed from the circuit and the amplifier output propagates through the antenna coupler 60 to the antenna 62. When the antenna load is perfectly matched with the output of the amplifier, there will be no reflected power and, thus, the average power detector 82 will see a maximum difference between the forward and reflected voltages (for a given output from amplifier 16) and will control the attenuation circuit within control block 12 accordingly. As will be noted, these signals are supplied from the directional wattmeter 26 which has output signals on 64 and 74 proportional respectively to the forward and reflected voltages along the line. The output signal whose voltage is proportional to the power dissipated in the load network may be obtained by squaring the voltages and taking the difference as an analog to the power in the load. From the above, it may be determined that the averaging power detector 82 must have a time constant which is at least slow enough to properly integrate at the lowest carrier frequency. In fact, if only detector 82 is used (and not detector 86), the circuit must also be slow enough to integrate at the modulation frequency.

If the load impedance were to drop, there would be more dissipation in the amplifier output devices than would be normally obtained in the balanced condition. Thus, a larger signal would be supplied from detector 38 than from detector 82 and this would effect a lowering of the signal on 14, thereby returning the dissipation in the output devices of amplifier 16 to safe limits.

When the device is in a normal transmission mode, instantaneous sampling of the reflected voltage ($V_R$) is required in lead 74 by threshold detector 100 to make sure that the load does not change. In the event of sudden and excessive load change, $V_R$ rises far enough above zero to initiate a new tuning cycle and cut back input drive to amplifier 16. In normal system operation, the antenna coupler receives a retune command any time the $V_R$ sample is nonzero. Before the retune is begun and the TIP state is achieved, the amplifier must rapidly cut back its drive, until the tune cycle is begun. As will be realized, the detection of load change must be faster than the thermal time constant of the output stage devices being protected. As may be noted from the detailed description, the threshold detector 100 is the only detector which, during tuning conditions, will provide an output which would swamp the output from dissipation detector 42. Thus, some means such as switch 48 of FIG. 1 or the circuit of FIG. 4b is needed to remove this detector from affecting the control block 12 during tuning conditions. When, in the normal mode (TIP) of operation, the detectors 82 and 84 are used to set the average power and peak power delivered to a tuned load, respectively. In general, the peak and average power capability of an amplifier are different, necessitating the use of the two detectors. As will be apparent to one skilled in the art, the average power detector 82 is used to control the average output power of amplifier 16. Peak detector 84, on the other hand, is used to control the output level of the amplifier 16 so that the spectral content of the signal through amplifier 16 will not be degraded.

From the above, and in summary, it will be determined that the present invention operates to keep maximum power (consistent with reliable operation) within the limits of the amplifier capability, directed to a load such as antenna 62. This is in contrast to the prior art which processed insufficient variables to be able to maximize output power into loads which present other than 1:1 VSWR's. To provide the desired results, an average load power detector means (66 and 82) it utilized which detects the difference between the forward and reflected powers, and compares this with the signal indicative of amplifier 16's DC input power as obtained from detector 38 to control the amplitude of input signals to the amplifier 16. This is a normal control signal while tuning.

During the tuning conditions, it is also desirable to have maximum power from the RF amplifier so as to permit interfacing with a multitude of antenna coupler types with differing sensitivities and feed line types and lengths. This is accomplished by using the difference between the RF amplifier average input power and the average load power to control the ALC block 12 and thereby adjust the input signal amplitude to amplifier 16. Since high voltages at the collector of the output stages may also damage the output transistors, a collector voltage detector 32 has been illustrated for taking over the feedback function in the event of high collector voltages.

Once tuning has been completed, the switches return to the $\overline{\text{TIP}}$ condition. In this condition, the difference between the forward and reflected power is supplied to the average power detector 82 and the peak detector 84. One of these two detectors will pass the signal through the appropriate diodes to provide control signals on lead 18 to control block 12. As long as the antenna 62 along with antenna coupler 60 remain tuned, the reflected voltage will be substantially zero and, thus, there will be no output on lead 78. With this action, the signals on lead 80 are substantially identical with those appearing on lead 70 from forward voltage squaring circuit 68. In a condition where the modulation envelope is substantially constant, the feedback signal will be obtained primarily from detector 82. When the modulation envelope varies substantially, the feedback signal will be obtained primarily from peak detector 84 to maintain the linearity of amplifier 16.

During $\overline{\text{TIP}}$ conditions, a variation in antenna load impedance will lower the signal appearing on lead 80. Thus, a threshold detector such as 100 is required to react to sudden load changes, as determined by reflected voltage, until the system has been returned to an initialization condition or retune command condition (TIP) and the attenuator is reinserted into the circuit.

While a low pass filter 22 has been illustrated in the block diagram of FIG. 1, such a filter would not be required when spurious levels of output signals from amplifier 16 are low enough to allow proper operation of wattmeter 26. Also, while the apparatus used for obtaining the reflected voltage signal on lead 74 and the average power delivered to the load on lead 80 comprise a directional wattmeter and voltage squaring circuits, along with a subtraction circuit, it will be apparent to those skilled in the art that these signals may be obtained by other circuitry.

From the above discussion, it will be apparent that the actual implementation of one embodiment of the invention was implemented in a cost effective manner to fit the particular requirements of a specific application. In the specific embodiment, it was determined that excessive voltage on the collectors of the output stages of amplifier 16 would not be a problem due to the type of output devices incorporated in the amplifier. Further, it was determined that a high speed average power detector such as 86 would not be needed due to the thermal time constant of the output devices used relative to the time constant of detector 82. Finally, the preferred logic utilizing switch 48 and the various back-biased diodes were actually implemented using a logical equivalent to that shown in FIG. 1 such as deactivating threshold detector 100 during tuning operations rather than activating during normal ($\overline{\text{TIP}}$) times.

Although the specific implementation and the block diagram are not identical, the concept still remains the same and it is believed that the implementation of blocks 32 and 86 would be completely apparent to anyone skilled in the art using the information in the specific schematics of FIGS. 2 through 4, especially since detector 86 could be implemented identical to that of detector 82 by merely changing the time constant in the feedback circuit and detector 30 could be implemented the same as detector 100, but with a different threshold setting.

While I have shown one block diagram and one specific implementation, I wish to be limited only by the inventive concept as specifically claimed in the attached claims.

I claim:

1. Amplifier apparatus for coupling to an antenna load comprising, in combination:
    RF amplifier means including RF signal input means, gain control means and RF signal output means;
    average power detection means, connected between said RF signal output means and said gain control means of said RF amplifier means, for controlling the level of said RF amplifier means during tuning in accordance with the difference between the average power delivered to a load and the average DC input power supplied to the amplifier to maintain dissipation in the output stage of said RF amplifier means within prescribed limits.

2. Apparatus as claimed in claim 1, comprising, in addition:
    threshold detection means, connected to said RF signal output means of said RF amplifier means, for providing initialization signals to said RF amplifier means whenever reflected signals from a load exceed predetermined values.

3. Apparatus as claimed in claim 1, comprising, in addition:
    initialization means, connected to said RF output means of said RF amplifier means, for inserting protective impedance means in an output load circuit of said amplifier means during tuning operations.

4. The method of protecting an RF amplifier against excess dissipation in the output stage due to antenna induced unmatched conditions comprising the steps of:
    monitoring the input DC power to the RF amplifier;
    monitoring the true power absorbed in the load; and
    adjusting the gain of the RF amplifier in accordance with the difference between said input and true power to maintain dissipation in the output stage of said RF amplifier within prescribed limits.

5. Apparatus for protecting an RF amplifier means, having an output stage, a gain control input means and a power output means, against excess dissipation in the output stage due to load impedance changes, comprising, in combination:
    RF amplifier means;

load impedance means connected to the power output means of said RF amplifier means;

first means, connected to said amplifier means, for monitoring the true power supplied by said RF amplifier means to said load impedance means and supplying a first signal indicative thereof;

second means, connected to said amplifier means, for monitoring the input DC power to said amplifier means and supplying a second signal indicative thereof;

means connected to said first and second means and to said gain control means of said RF amplifier means, for adjusting the level of said RF amplifier means in accordance with the difference between the signals obtained from said first and second means to maintain dissipation in the output stage of said RF amplifier means within prescribed limits.

6. Amplifier apparatus for coupling to an antenna, comprising, in combination:

RF amplifier means, including RF signal input means, gain control means, and RF signal output means;

first means for supplying RF power signals to an antenna means;

second means, connected to said first means, for providing variable value output signals directly indicative of power output by said first means to the antenna means;

third means, connected to said first means, for supplying variable value output signals directly indicative of power reflected to said first means from the antenna means;

fourth means, connected to said second and third means, for receiving output signals therefrom and supplying as an output of said fourth means a variable amplitude feedback signal directly indicative of the difference between the received signals;

fifth means connecting said amplifier means to said first means for supplying RF power output signals thereto;

average power detector means, connected to said fourth means for receiving output signals therefrom;

peak power detector means, connected to said fourth means, for receiving output signals therefrom; and logic means, connected to the average power detector means, the peak detector means and the gain control means of said RF amplifier means, for providing as a feedback signal to the RF amplifier means at least one of the output signals from said two detector means.

7. Amplifier apparatus for coupling to an antenna, comprising, in combination:

RF amplifier means, including RF signal input means, gain control means, and RF signal output means;

first means for supplying RF power signals to an antenna means;

second means, connected to said first means, for providing variable value output signals directly indicative of power output by said first means to the antenna means;

third means, connected to said first means, for supplying variable value output signals directly indicative of power reflected to said first means from the antenna means;

fourth means, connected to said second and third means, for receiving output signals therefrom and supplying as an output of said fourth means a variable amplitude feedback signal directly indicative of the difference between the received signals;

fifth means connecting said amplifier means to said first means for supplying RF power output signals thereto;

sixth means, connected between said fourth means and said gain control means of said RF amplifier means for supplying feedback signals thereto;

seventh means, connected to said amplifier means, for providing an output signal indicative of DC power input to said amplifier means;

dissipation detection means, connected to said sixth and seventh means, and supplying as a tuning signal a signal indicative of a comparison of received signals; and switch means as part of said sixth means, connected to said dissipation detection means, for alternatively supplying to said gain control means of said amplifier means the feedback and tuning signals.

* * * * *